(12) United States Patent
Haidar et al.

(10) Patent No.: US 10,851,469 B2
(45) Date of Patent: Dec. 1, 2020

(54) SYNTHESIS OF CORE-SHELL NANOPARTICLES AND APPLICATIONS OF SAID NANOPARTICLES FOR SURFACE ENHANCED RAMAN SCATTERING

(71) Applicants: Universite Paris Diderot, Paris (FR); Centre National de la Recherche Scientifique (CNRS), Paris (FR); Institut De Physique Du Globe De Paris, Paris (FR)

(72) Inventors: Israa Haidar, Paris (FR); Daniel Neuville, Montreuil (FR); Leila Boubekeur, Créteil (FR); Nordin Felidj, Levallois-Perret (FR)

(73) Assignees: Universite Paris Diderot, Paris (FR); Centre National de la Recherche Scientifique (CNRS), Paris (FR); Institut De Physique Du Globe De Paris, Paris (FR)

( * ) Notice: Subject to any disclaimer, the term of this patent is extended or adjusted under 35 U.S.C. 154(b) by 0 days.

(21) Appl. No.: 16/341,762

(22) PCT Filed: Oct. 11, 2017

(86) PCT No.: PCT/FR2017/052798
§ 371 (c)(1),
(2) Date: Apr. 12, 2019

(87) PCT Pub. No.: WO2018/069646
PCT Pub. Date: Apr. 19, 2018

(65) Prior Publication Data
US 2020/0048788 A1    Feb. 13, 2020

(30) Foreign Application Priority Data
Oct. 13, 2016 (FR) ..................... 16 59934

(51) Int. Cl.
$C03B\ 7/14$ (2006.01)
$C30B\ 7/14$ (2006.01)
$C30B\ 29/02$ (2006.01)
$C30B\ 29/60$ (2006.01)
(Continued)

(52) U.S. Cl.
CPC ............. $C30B\ 7/14$ (2013.01); $C30B\ 29/02$ (2013.01); $C30B\ 29/60$ (2013.01); $G01N\ 21/658$ (2013.01); $B82Y\ 30/00$ (2013.01); $B82Y\ 40/00$ (2013.01)

(58) Field of Classification Search
CPC ............ C30B 7/14; C30B 29/02; C30B 29/60
See application file for complete search history.

(56) References Cited

U.S. PATENT DOCUMENTS

2006/0207388 A1    9/2006   Mirkin et al.
2010/0046072 A1*   2/2010   Matsunami ........... B22F 1/0022
                                                      359/487.06
(Continued)

OTHER PUBLICATIONS

Gonzalez et al, Photochemical Strategies for the Facile Synthesis of Gold-Silver Alloy and Core-shell Bimetallic Nanoparticles, J Physical Chemistry C 2009 113, pp. 11861-11867.*
(Continued)

*Primary Examiner* — Robert M Kunemund
(74) *Attorney, Agent, or Firm* — Sughrue Mion, PLLC

(57) ABSTRACT

A method of synthesizing of gold-silver core-shell nanoparticles, from a colloidal aqueous solution of gold seeds with surfactant, the gold-silver core-shell nanoparticles being produced from anisotropic gold seeds, said method comprising adding to the colloidal aqueous solution a precursor of silver and a reducing agent, to produce the deposition of silver on the gold seeds in a step called principal, characterized in that the method has an incubation step of the colloidal aqueous solution containing the gold seeds with surfactant in the DMSO, prior to the principal step.

25 Claims, 6 Drawing Sheets

(51) Int. Cl.
*G01N 21/65* (2006.01)
*B82Y 30/00* (2011.01)
*B82Y 40/00* (2011.01)

(56) References Cited

U.S. PATENT DOCUMENTS

2014/0308756 A1* 10/2014 Gautier ................ B22F 1/0018
436/501
2015/0155449 A1* 6/2015 Kim ........................ H01L 33/50
257/13

OTHER PUBLICATIONS

Boris N. Khlebtsov et al: "Surface-Enhanced Raman Scattering Substrates Based on Self-Assembled PEGylated Gold and Gold-Silver Core-Shell Nanorods", Journal of Physical Chemistry C, vol. 117, No. 44, Jan. 1, 2013 (Jan. 1, 2013), pp. 23162-23171.
Randa Ahmad et al: "Tailoring the Surface Chemistry of Gold Nanorods through Au—C/Ag—C Covalent Bonds Using Aryl Diazonium Salts", Journal of Physical Chemistry C, vol. 118, No. 33, Aug. 21, 2014 (Aug. 21, 2014), pp. 19098-19105.
N. Felidj et al: "Morphology of Silver and Gold "SERS Active" Substrates from Optical Spectroscopy Experiments and Numerical Simulations", Physica Status Solidi (A). Applied Research, vol. 175, No. 1, Sep. 1, 1999 (Sep. 1, 1999), pp. 367-372.
Lili Feng et al: "Preparation of gold nanorods with different aspect ratio and the optical response to solution refractive index", Journal of Experimental Nanoscience, vol. 10, No. 4, Aug. 25, 2013 (Aug. 25, 2013), pp. 258-267.

\* cited by examiner

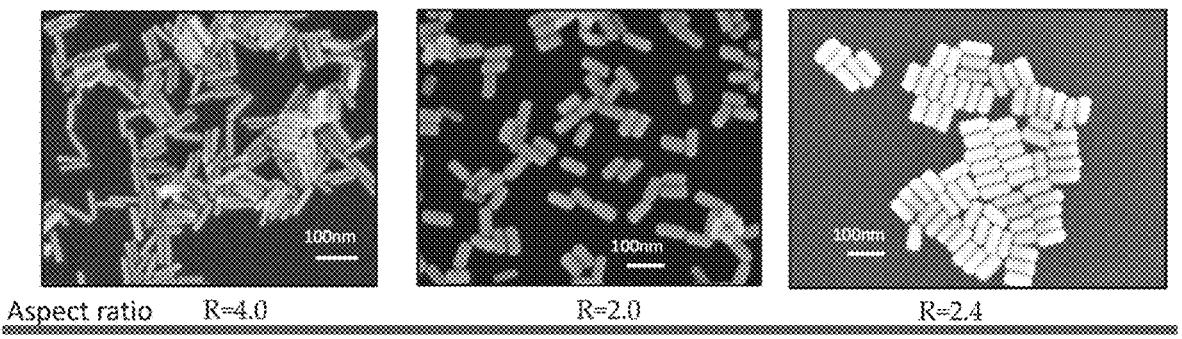
Fig. 1
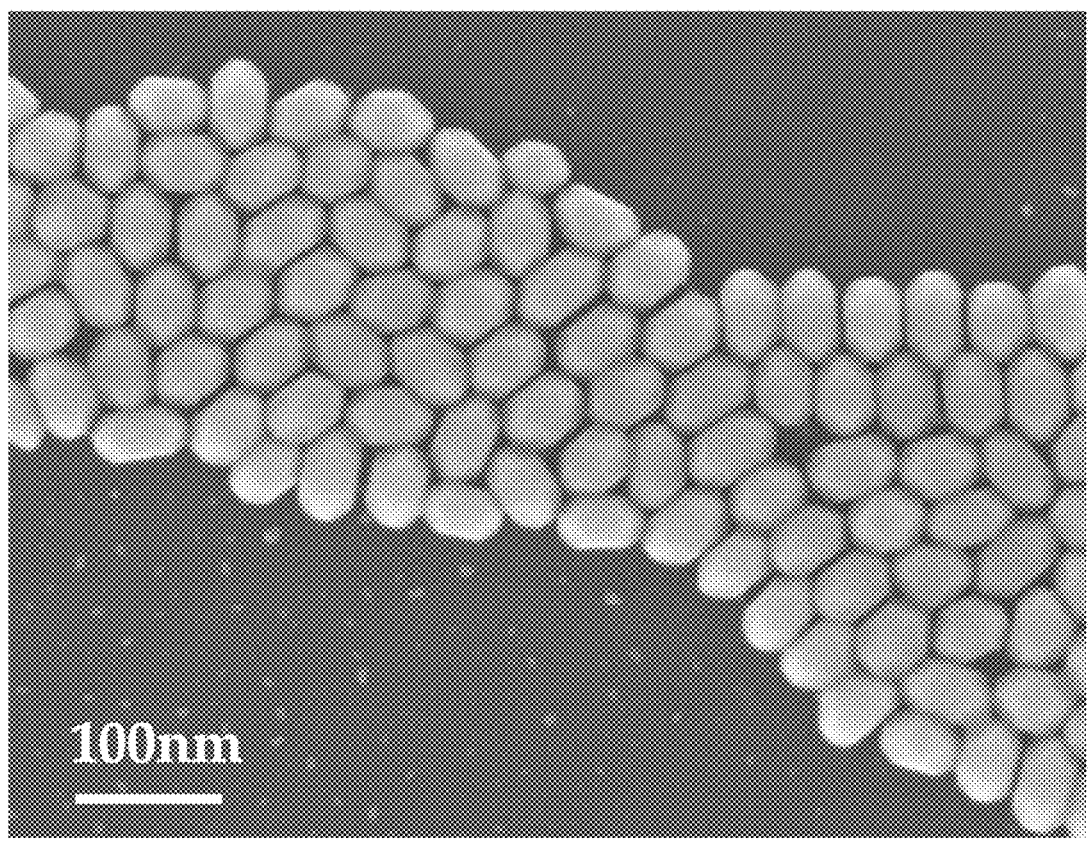
Fig. 2-A

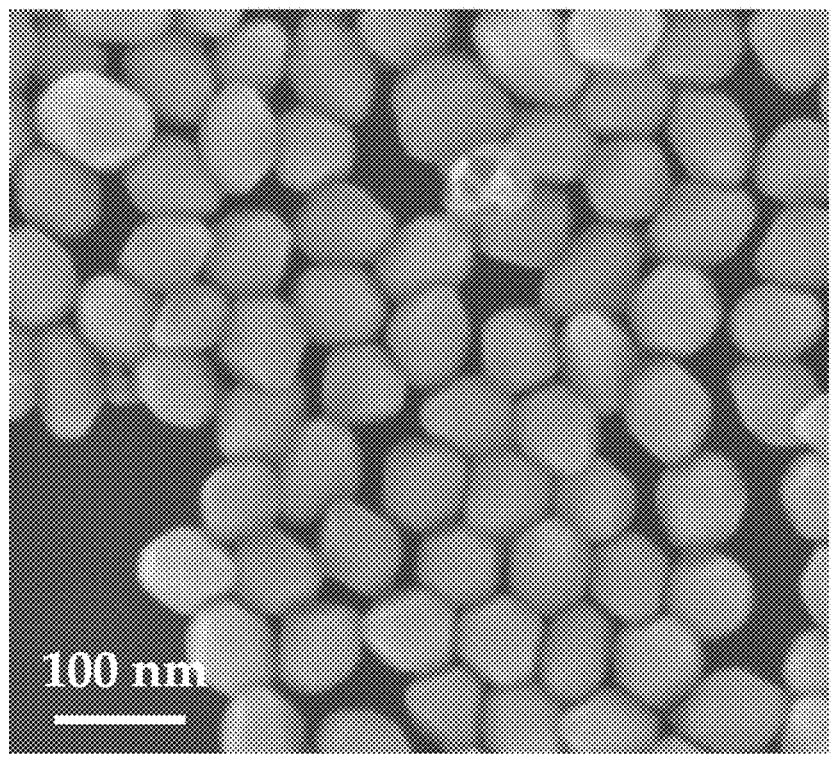
Fig. 2-B
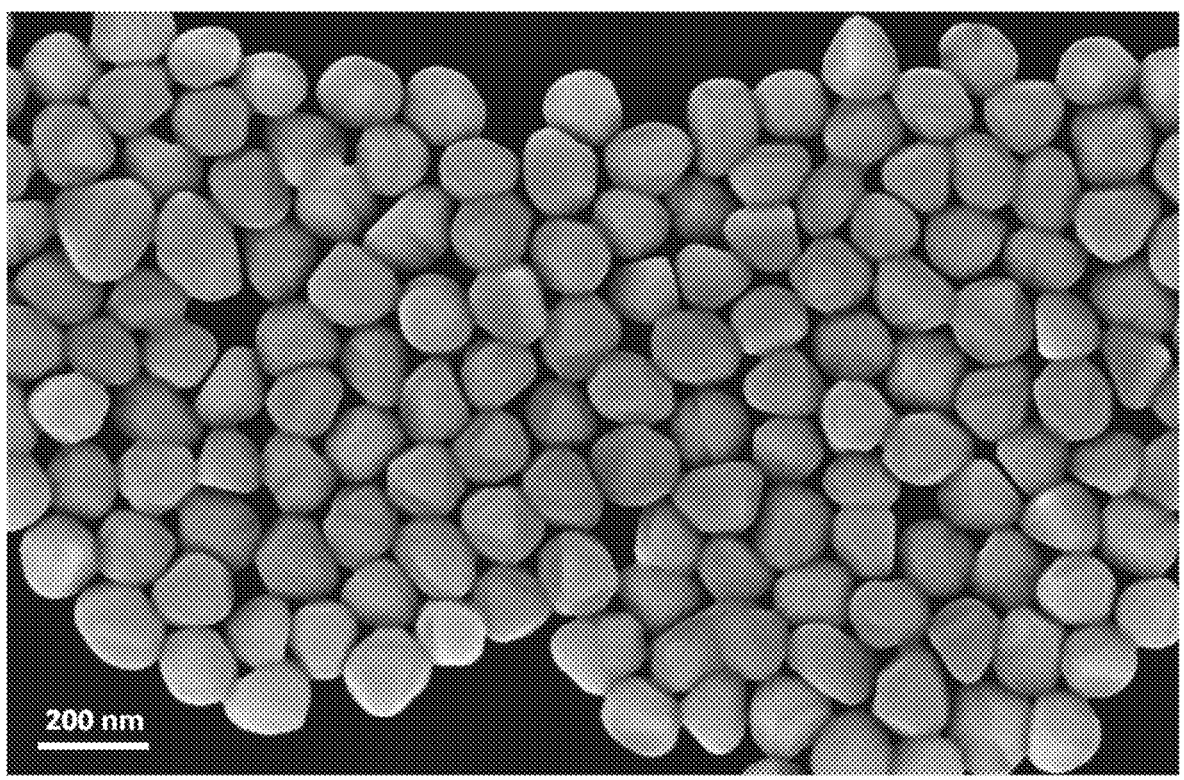
Fig. 3

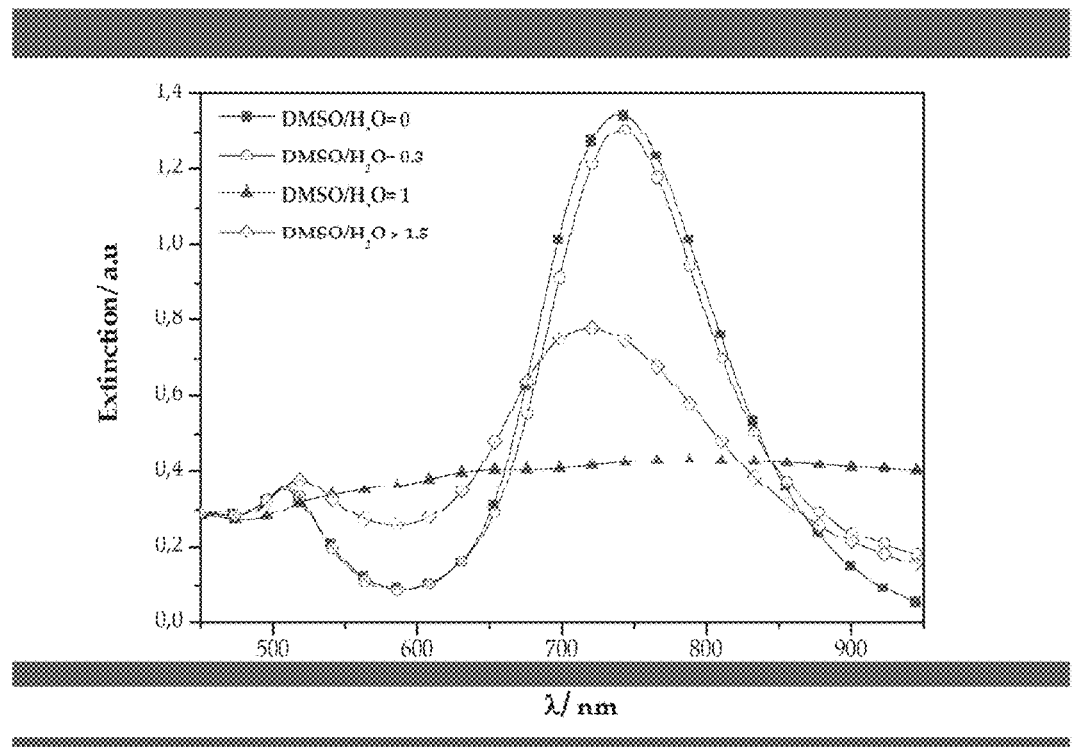
Fig. 4
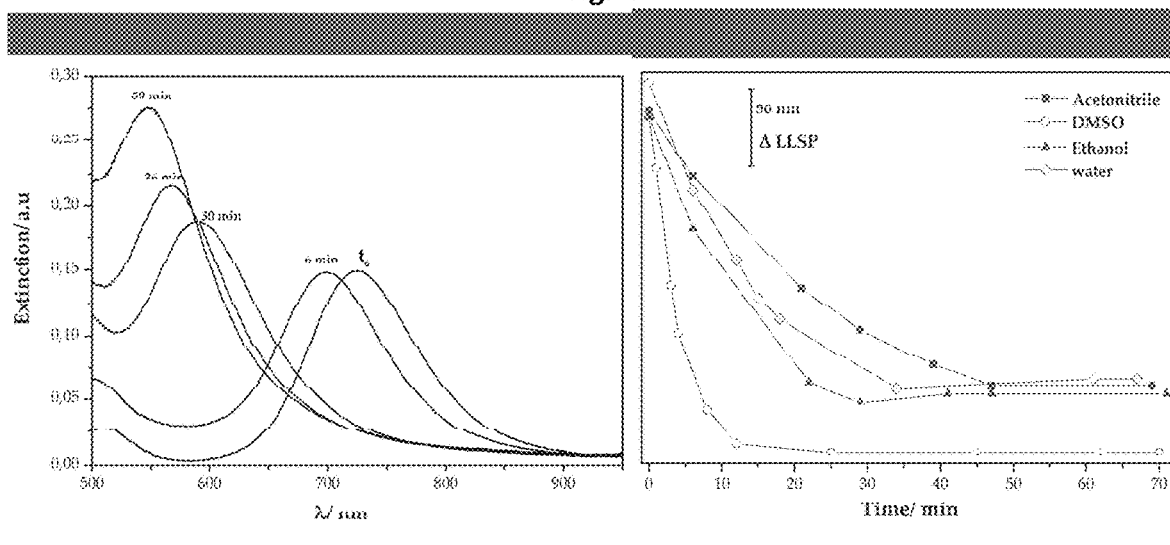
Fig. 5-A
Fig. 5-B

SYNTHESIS OF CORE-SHELL NANOPARTICLES AND APPLICATIONS OF SAID NANOPARTICLES FOR SURFACE ENHANCED RAMAN SCATTERING

CROSS REFERENCE TO RELATED APPLICATIONS

This application is a National Stage of International Application No. PCT/FR2017/052798 filed Oct. 11, 2017, claiming priority based on French Patent Application No. 1659934 filed Oct. 13, 2016.

TECHNICAL FIELD

The invention relates to the synthesis of core-shell type metal nanoparticles, by a bottom-up type approach, from a colloidal solution.

The invention finds advantageous application for producing substrates for surface enhanced Raman scattering (SERS).

Definitions

"Substrate for surface enhanced Ramen scattering" here denotes a support, for example of silicon, on which a solution containing metal nanoparticles is placed.

"Nanoparticles" here denotes a set of polyatomic structures of nanometric size, typically varying between 1 and 200 nm, in to any one of the three dimensions.

"Metal nanoparticles" here denotes in particular nanoparticles of noble metals, and particularly gold and silver.

"Core-shell type metal nanoparticles" here denotes nanoparticles formed from a core of a first noble metal, particularly gold, encased in a shell of a second noble metal, particularly silver.

STATE OF THE ART

Methods of synthesis of metal nanoparticles can be classified into two groups: top-down and bottom-up.

The top-down approaches make it possible to start from the bulk material, then reduce it into finer and finer compounds, for example electrochemically, by aqueous phase laser ablation, grinding of powders, lithography. Gold nanoparticles have been produced by laser ablation in water, or in acetone, toluene, tetrahydrofuran, acetonitrile. Amendola et al (*Synthetic metals*, Vol. 155, Issue 2, 2005, pp. 283-286) describe laser ablation in dimethylsulfoxide (DMSO, CAS 67-68-5), allowing the functionalization of the gold nanoparticles by fullerene derivatives.

The bottom-up approaches start with the smallest possible chemical entities, such as atoms or molecules that are assembled progressively to form a nanoparticle. The bottom-up approaches typically implement reduction or decomposition reactions, in gaseous, liquid or solid phase, by physical (laser pyrolysis, CVD deposition), or by chemical methods (chemical, electrochemical, photochemical, sol-gel).

Surface enhanced Raman scattering (SERS) is based primarily on the use of SERS substrates (generally metals such as Au, Ag, Cu) having singular optical properties, related to the excitation by light of localized surface plasmons (Localized Surface Plasmon Resonance—LSPR).

Typically, a SERS substrate is in the form of metal nanoparticles (in solution or on solid support) or rough metal film deposited on flat surface (glass, silicon slide).

SERS substrates can be active or passive, active substrates allowing selectivity of the substrate, by functionalization, for example use of an antigen detect an antibody.

The vibrational characteristics of the molecules obtained by Raman diffusion are generally very weak, but in the presence of nanoparticles of noble metals, these signals are considerably amplified.

Molecules adsorbed on the surface of the metal nanoparticles undergo a SERS effect due to the strong electromagnetic field undergone by the molecules in the vicinity of the metal's surface. The field confinement closest to the metal results in the excitation of the localized surface plasmons.

Surface enhanced Raman scattering (SERS) has thus become an indispensable vibrational spectroscopy used in fields as varied as biology, analytical chemistry, identification, preservation and restoration of works of art, or forensics.

SERS applications are typically those in which the concentration of the compound to be detected is low, relative to the sensitivity of the Raman (for example identification of contaminants, pollutants, biological liquids during scientific police investigations), or when the analyses are difficult without preparation (identification of microorganisms for the agro-food industry or medical hygiene, cellular imaging) or in medical diagnostics.

By way of illustration, SERS is proposed for the detection of drug taking (e.g. Nuntawong et al, *Detection of methamphetamine/amphetamine in human urine based on surface-enhanced Raman spectroscopy and acidulation treatments, Sensors and Actuators B: Chemical*, Volume 239, 2017, Pages 139-146), detection of explosives, pollutants such as pesticides or heavy metals (e.g. mercury), Sun et al, *Recent progress in detection of mercury using surface enhanced Raman spectroscopy—A review, Journal of Environmental Sciences*, Volume 39, 2016, Pages 134-143).

SERS, long considered as a remarkable physical phenomenon but purely fundamental, little by little has become a powerful and effective analytical tool for enhancing (in the sense of amplifying) by several orders of magnitude ($10^3$-$10^7$) the Raman signal from molecules.

Technical Problems

Producing SERS substrates is complex.

As mentioned above, the enhanced Raman is governed by the excitation of the LSPR plasmons, which assumes a good match between the laser enhancement wavelength (Raman) and the position of the plasmon resonance.

For spherical metal nanoparticles, the position and width of the plasmon band is influenced by the size of the nanoparticles. Furthermore, the oscillation mode of a particle's surface electrons of is specific to its geometry. An isotropic particle, such as a spherical particle, will have a single mode, while a complex or an anisotropic particle (such as a rod) will have more than one plasmon resonance mode. A rod-shaped or ellipsoidal particle will have two electron resonance modes: a transverse component, related to the diameter, and a longitudinal component, related to the length of the rod. For rod-shaped metal nanoparticles, the aspect ratio of the nanoparticles (length/diameter) has an influence on the plasmon band corresponding to the longitudinal component. The dispersion of the nanoparticles also has an influence, by coupling between the resonant modes of neighboring nanoparticles.

The generation of localized surface plasmons, responsible for the increase of the interaction between the monochromatic light generated by a laser and a probe molecule, is related to the presence in the substrate of "hot points", this expression denoting spatial areas of dimensions smaller than the wavelength, a high point being able to be produced in proximity of two very close nanoparticles (1 to 4 nm) where the electromagnetic field is localized and intense.

The possibility of producing and controlling hot points is thus tied to the production of SERS substrates having controlled nanostructures.

The quality of a SERS substrate is measured not only by its amplification performances of the Raman signal (quantified by the enhancement factor EF), but also by the reproducibility of its fabrication and response, as well as its stability over time.

Research in optimized SERS substrates is extremely active, because in spite of the great advances in this field, there remain numerous challenges in terms of (i) intrinsic qualities and (ii) versatility.

The fabrication of SERS and substrates by deposition of colloids then drying is an expertise all on its own. Indeed, the use of protocols abundantly described in the literature for preparing active SERS colloids in no way guarantees the ability to reproduce the size or shapes of objects. There is an indispensable need for end users of SERS as an analytical technique, to have substrates that are ready to use, where all that needs to be done is deposit a drop of the solution to be analyzed.

The development of SERS substrates that are effective over a wide range of excitation wavelengths also forms part of the challenges in the field.

The synthesis methods of metal nanoparticles known in the prior art have numerous disadvantages that do not allow an optimal use in the production of substrates for surface enhanced Raman scattering.

Substrates obtained by lithography and engraving on thin layers are reproducible and stable over time, but their fabrication is complex and very expensive.

Colloidal solutions (gold, silver) or sols-gels are less costly, but can give rise to difficulties, particularly in shelf life prior to use, as well as in reproducibility. Colloids can flocculate then be placed in suspension, but can also precipitate and aggregate irreversibly.

Electrochemical reduction involves burdensome conditions, such as the use of ultrasound and a constant electrolysis current, and it is difficult to control the uniformity of the nanoparticles obtained by these methods.

Gold nanoparticles of different shapes have been synthesized by electrochemistry in the presence of a surfactant.

Huang et al (*Electrochemical synthesis of gold nanocubes, Materials Letters.* July 2006 60 (15):1896-1900) describe the synthesis of cube-shaped gold nanoparticles by electrolysis (anode Au, cathode Pt) of a solution containing acetone and two surfactants: CTAB (hexadecyltrimethylammonium bromide or cetrimonium bromide): $(CH_3)_3N(CH_2)_{15}CH_3Br$, CAS 57-09-0) and TTAB (tetradecyltrimethylammonium bromide $C_{17}H_{38}BrN$, CAS 1119-97-7).

Ma et al (*Synthesis of silver and gold nanoparticles by a novel electrochemical method, Chemphyschem.* 2004 Jan. 23; 5(1): 68-75) describe the synthesis of spherically shaped gold nanoparticles by electrolysis of an aqueous solution containing PVP (Polyvinylpyrrolidone, CAS 9003-39-8).

Sharma et al (*Electrochemical synthesis of gold nanorods in track-etched polycarbonate membrane using removable mercury cathode, Journal of Nanoparticle Research.* 2012, Vol. 14 Issue 9, p1-10) describe the synthesis of rod-shaped gold nanoparticles by deposition on a nanoporous polycarbonate membrane.

Yu et al (*Gold nanorods: electrochemical synthesis and optical properties, The journal of physical chemistry,* 101, 34, pp. 6661-6664) describe the synthesis of rod-shaped gold nanoparticles by electrolysis (anode Au, cathode Pt) of a solution containing acetone and two surfactants (CTAB et TC8AB tetraoctylammonium bromide CAS 14866-33-2).

Syntheses by microwave radiation, radiolysis, photochemistry and sonochemistry are complex and expensive, and require a great deal of energy. Radiolysis requires the use of a particle accelerator.

A large number of syntheses by chemical reduction, using a mixture of metal salt/solvent/reducing agent/surfactant have been proposed, although it is not possible to effectively control the geometry of the nanoparticles obtained. In these mixtures, the salt is the precursor containing the metal, the solvent is polar, aqueous or organic (polyol, toluene), the dipole moment of the solvent being rather high to break the bonds of the salt and dissolve it, the reducing agent reduces the dissolved metal species in order to precipitate them, and the surfactant protects the particles by being adsorbed on their surface in order to prevent their agglomeration.

In Turkevich type syntheses, for producing gold nanoparticles that are quasi-spherical in shape and mono-dispersed in suspension in water, tetrachlorauric acid is reduced by the citrate, which acts both as reducing agent and surfactant.

In Brust type syntheses, chlorauric acid reacts with tetraoctylammonium bromide (transfer agent) in toluene (solvent) and sodium borohydride (reducing agent).

The invention relates more specifically to the synthesis of metal nanoparticles, of the core-shell type, by a bottom-up type approach, by colloidal chemistry, the core being in the form of rods.

The production of metal nanoparticles, particularly of gold, in the form of rods is known per se. For example, reference can be made to the growth mechanism called zipping, described in the document *Hébié Etudes électrochimiques des nanoparticules d'or corrélation structure/activité,* 2013.

In particular, the invention seeks to provide gold/silver metal nanoparticles of the core-shell type, by a bottom-up approach, by colloidal chemistry, the core being in the form of rods, in particular rods of gold, the silver shell being monocrystalline.

Examples of syntheses of gold-silver core-shell nanoparticles are presented in the following documents:
Bai et al, *Acs Applied Materials & Interfaces* 2014, 6 (5), 3331-3340;
Cho et al *Advanced Materials* 2010, 22 (6), 744;
Zhang et al *Chemistry of Materials* 2016, 28 (8), 2728-2741;
Jing, H et al *Nano Letters* 2014, 14 (6), 3674-3682;
Pastoriza-Santos, *Langmuir* 2002, 18 (7), 2888-2894;
Zhuo et al *Acs Nano* 2015, 9 (7), 7523-7535;
Liu et al *Physical Chemistry Chemical Physics* 2015, 17 (10), 6819-6826; Yang et al *Journal of the American Chemical Society* 2014, 136 (23), 8153-8156;
Yang et al *Chemistry European Journal* 2015, 21 (3), 988-992;
Zhang et al *Chemistry European Journal* 2013, 19 (38), 12732-12738.

Khlebtsov et al (*Au@Ag core/shell cuboids and dumbbells: Optical properties and SERS response, Journal of Quantitative Spectroscopy and Radiative Transfer,* Volume 167, 2015, Pages 64-75) describe the synthesis of gold/silver core-shell nanoparticles, for the production of SERS substrates, from gold rods placed in a solution of CTAC (hexadecyltrimethylammonium chloride $CH_3(CH_2)_{15}N(Cl)$ ($CH_3$)$_3$, CAS 112-02-7), forming the core, the deposit of the silver shell being obtained by addition of the silver nitrate, ascorbic acid and sodium.

The document WO 2016/046645 describes the synthesis of asymmetric gold nanoparticles, by reaction of gold rods in the presence of a solvent such as water, a precursor ($HAuCl_4$), a ligand such as a thiol (4-mercaptophenol) and a reducing agent (ascorbic acid), a high concentration of ligand inhibiting the growth of the gold by epitaxy on the rods, and favoring an asymmetrical growth. The applications mentioned are the capture of solar energy and the production of substrates for SERS.

OBJECTS OF THE INVENTION

A first object of the invention is to resolve the problems presented above, by offering an original means of synthesizing core-shell metal nanoparticles, in particular gold/silver, said synthesis being economical and allowing the production of a wide variety of shapes of nanoparticles, in a controlled way.

Another object of the invention is to provide a colloidal solution of metal nanoparticles, adapted to the production of substrates for surface enhanced Raman scattering SERS.

Another object of the invention is to provide a SERS sensor, particularly for a pollutant such as atrazine.

GENERAL INTRODUCTION OF THE INVENTION

To those ends, according to a first aspect, a method is proposed of synthesis of gold-silver core-shell nanoparticles, from a colloidal aqueous solution of gold seeds with surfactant, the gold-silver core-shell nanoparticles being produced from anisotropic gold seeds, said method comprising adding to the colloidal aqueous solution a precursor of silver and a reducing agent, to produce the deposition of silver on the gold seed in a step called principal, the method having an incubation step of the colloidal aqueous solution containing the gold seeds with surfactant in a mixture of water+DMSO, prior to the principal step carried out with the resultant colloidal aqueous solution of gold (gold seeds+water+DMSO+surfactant).

Thus, a method is proposed of synthesizing gold-silver core-shell nanoparticles from a colloidal aqueous solution of gold seeds with surfactant, the gold-silver core-shell nanoparticles being produced from anisotropic gold seeds, the method comprising successively:
  an incubation step of the colloidal aqueous solution containing the gold seeds with surfactant, in a water and DMSO mixture, for a first given period of time;
  a step adding a surfactant;
  a heating step for a second given period of time;
  a step adding to the resultant colloidal solution a precursor of silver and a reducing agent, to produce the deposition of silver onto the gold seeds in a step called principal during a third period of time;
  an extraction step of the nanoparticles.

In some implementations, the third period of time ranges from a few minutes to about 20 hours.

The DMSO (dimethylsulfoxide, CAS 67-68-5) is a dipolar aprotic solvent. This type of solvent has mesomeric effect charges and is coordinated on a CFC (111) gold mesh. Consequently, said layer may contaminate the surface of the gold, thus inhibiting the growth of the silver. The points of the nanorods, essentially composed of facets (111), can be coordinated by the co-solvent, thus significantly disturbing the diffusion towards the surface and the deposition of silver on said facets An aprotic solvent has no acidic hydrogen atom. A dipolar aprotic solvent cannot form a hydrogen bond, and their molecules act as dipoles.

Dipolar aprotic solvents are for example DMSO (dimethylsulfoxyde, CAS 67-68-5), DMF (dimethylformamide CAS 68-12-2), acetonitrile ($CH_3CN$, CAS 75-05-8), NMP (N-methyl-2-pyrrolidone, CAS 872-50-4).

According to diverse implementations, the method has the following features, combined where applicable:
  the ratio between the volume of DMSO and the total volume of water is less than 2; total volume of water is understood as the volume contributed by the colloidal aqueous solution containing the gold seeds with surfactant and by the water present in the water+DMSO mixture;
  the ratio between the volume of DMSO and the total volume of water is less than or equal to 0.33; advantageously the ratio is around or equal to 0.33, which makes it possible to have essentially well dispersed gold seeds and to incorporate a single seed of gold in a silver shell;
  the ratio between the volume of DMSO and the total volume of water falls between 0.33 and 1; advantageously the ratio is around or equal to 1, which makes it possible to have essentially point-to-point (head-to-head) assemblies of gold seeds encased then by a silver shell;
  the ratio between the volume of DMSO and the total volume of water falls between 1 and 1.5; advantageously the ratio is around or equal to 1.5, which makes it possible to incorporate gold seeds face-to-face FF in a silver shell;
  the ratio between the volume of DMSO and the total volume of water is greater than 1.5; this again makes it possible to have essentially well dispersed gold seeds and to incorporate a single seed of gold in a silver shell, as shown in FIG. 9;
  the method successively comprises
    the incubation step of the colloidal aqueous solution containing the gold seeds with surfactant in the DMSO, for a first given period of time;
    a step adding another surfactant;
    a heating step for a second given period of time;
    the principal step of reaction of the gold seeds with the precursor of silver and the reducing agent in the colloidal aqueous solution of gold seeds;
    after a third given period of time, a step of centrifuging the mixture;
  the reaction step comprises the addition of surfactant with the reducing agent;
  the surfactant can be cetyltrimethylammonium chloride (CTAC) and/or cetyltrimethylammonium bromide (CTAB);
  the reducing agent is ascorbic acid (AA);
  the silver precursor is silver nitrate.

According to a second aspect, proposed are gold-silver core-shell nanoparticles produced from gold seeds in elongated form, obtained by the method as presented above, the gold-silver core-shell nanoparticles having at least two seeds of gold per core for one shell of silver enclosing the core.

In one implementation, the gold seeds are disposed head-to-head (HH) in the silver shell.

In another implementation, the gold seeds are disposed face-to-face (FF) in the silver shell.

Advantageously, the gold seeds are nanorods.

According to another aspect, a colloidal solution is proposed comprising gold-silver core-shell nanoparticles such as those presented above.

According to another aspect, a substrate is proposed for surface enhanced Raman scattering (SERS) comprising gold-silver core-shall nanoparticles as presented above.

Advantageously, such a substrate is applied to the detection of organic pollutants.

In one implementation, the organic pollutant is atrazine (CAS 217-617-8).

LIST OF FIGURES

Other objects and advantages of the invention will be seen from the following description of an embodiment, provided with reference to the appended drawings in which:

FIG. 1 is a view by scanning electronic microscopy of gold nanoparticles in the form of nanorods of different aspect ratios (ratio of the largest dimension to the smallest dimension);

FIGS. 2-A and 2-B present a view by scanning electronic microscopy of gold/silver core-shell nanoparticles, according to one implementation of the method according to the invention;

FIG. 3 is a view by scanning electronic microscopy of gold/silver core-shell nanoparticles resulting from the overgrowth of silver on gold/silver core-shell nanoparticles, according to another implementation of the method according to the invention;

FIG. 4 is an absorption spectrum of the gold nanoparticles solutions for different additions of DMSO;

Figure 6:
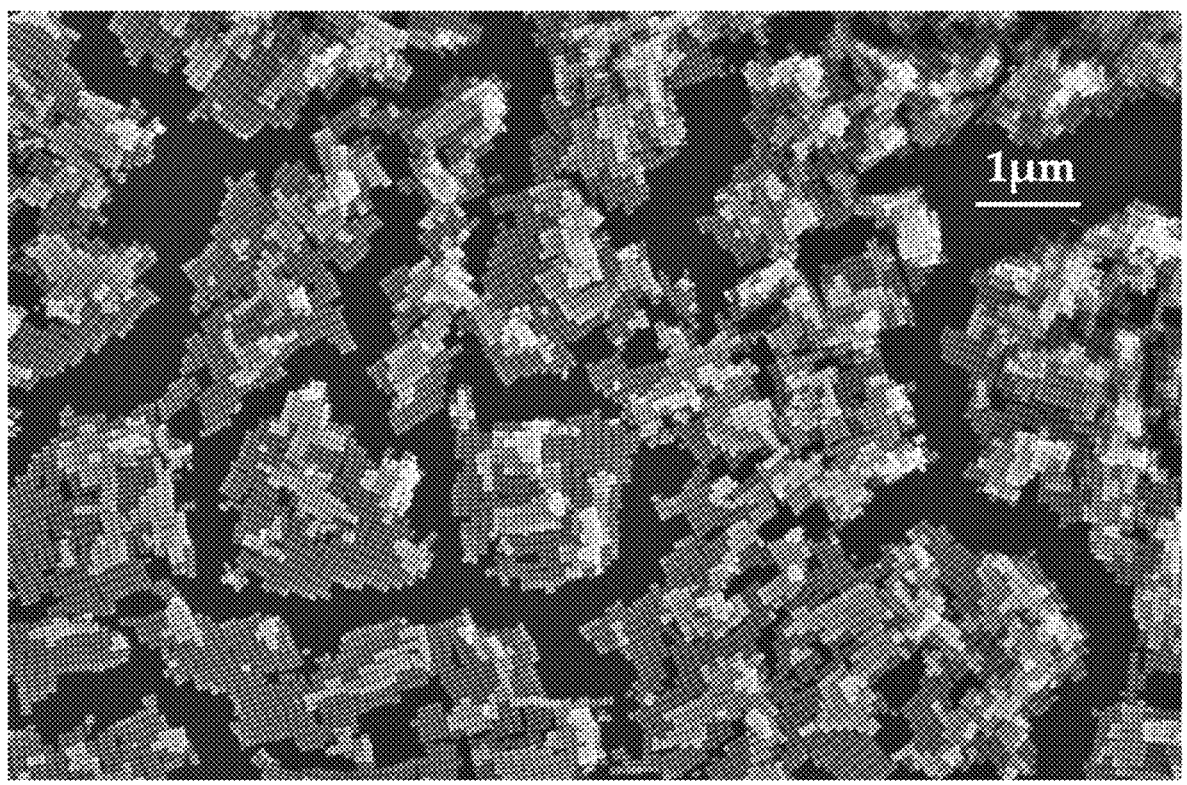
Figure 7:
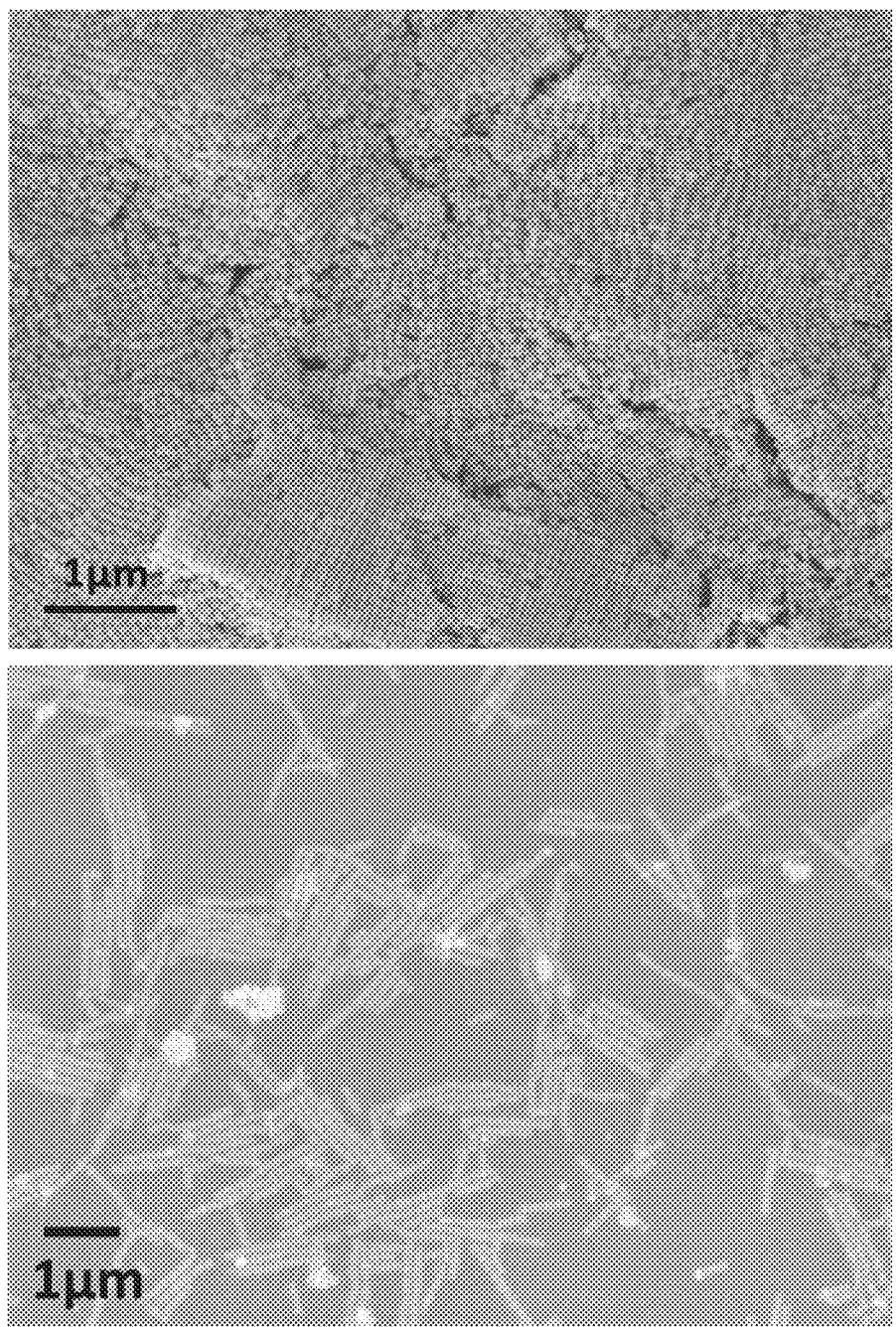
Figure 8:
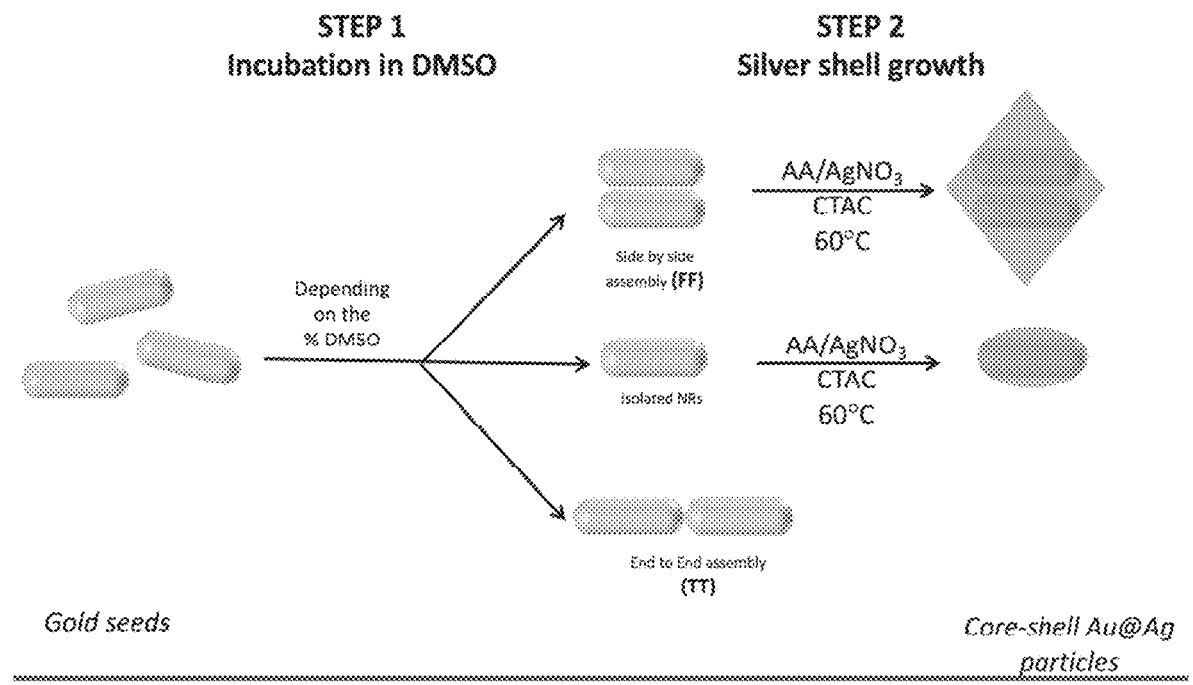
Figure 9:
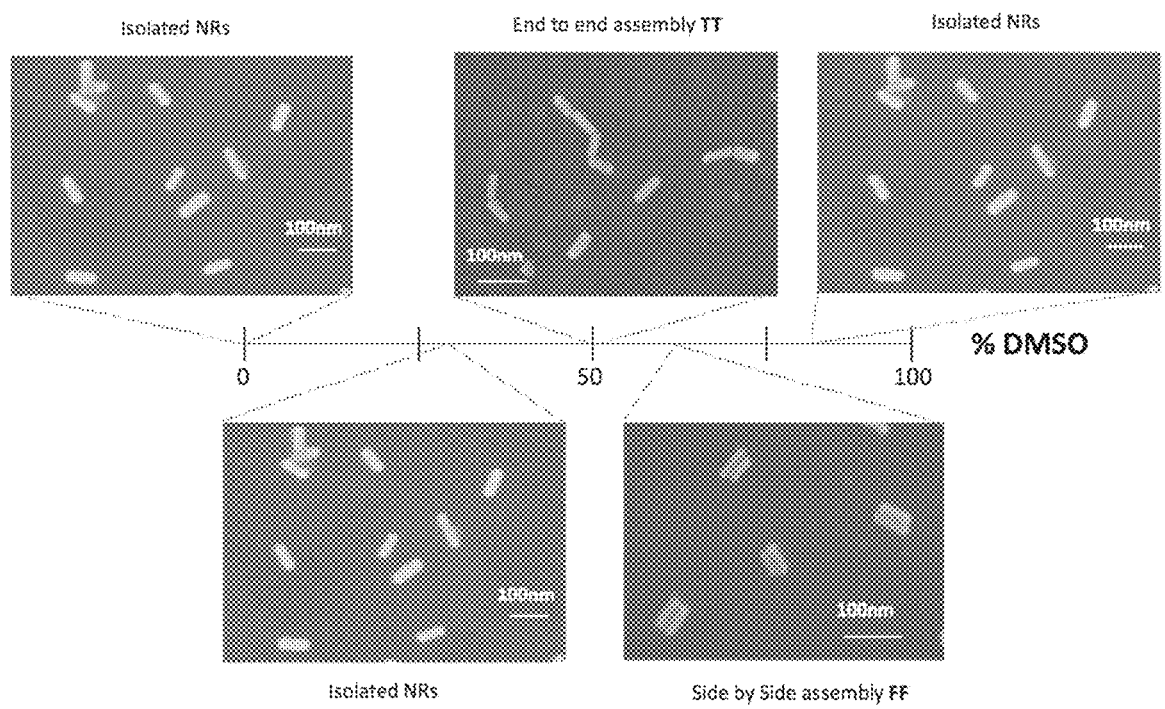

FIG. 5-A is a graph representing the development of the absorption spectrum of the colloidal solutions over time after addition of silver nitrate and ascorbic acid; FIG. 5-B is a graph representing the development of the wavelength of the maximum of the longitudinal resonance as a function of time, following the addition of silver nitrate and ascorbic acid in solutions containing gold nanoparticles, using different co-solvents (MeCN, DMSO, EtOH), or without the use of co-solvent;

FIGS. 6 and 7 are views by scanning electronic microscopy of arrangements of nanoparticles obtained according to a synthesis method according to the invention;

FIG. 8 is a schematic representation of the synthesis method according to the proportions of DMSO in the reactional medium and the resulting core-shell particles;

FIG. 9 is a schematic representation of the effect of the DMSO on the properties of gold nanoparticles, with DMSO=(Volume of DMSO)/(Total volume) with Total volume=Volume of water+Volume of DMSO.

DETAILED DESCRIPTION OF EMBODIMENTS

In a first step, a synthesis of gold nanorods is carried out according to a conventional method.

As has been mentioned, the synthesis of gold nanorods, in colloidal solution, is known per se, and will therefore not be described again here.

The gold nanorods are of the general shape represented in FIG. 1. By way of illustration, three families of nanorods used in the syntheses are presented from left to right in FIG. 1 for aspect ratios of 4.0 (55×14 nm), 2.0 (76×37 nm) and 2.4 (96×40 nm). The sizes between parentheses expressed in nanometers represent, in order, the average length along the large axis of the rod and along the small axis.

The gold nanorods are incubated in a dipolar aprotic solvent.

In one implementation, said solvent is dimethyl sulfoxide DMSO.

By way of example, the gold nanorods (120 µl to 1.82 nM) are incubated in 100 µl of dimethyl sulfoxide DMSO for 30 minutes.

Then, the gold nanorods are transferred to a solution of CTAC (cetyltrimethylammonium chloride) and heated.

For example, the nanorods are transferred to a solution of CTAC (26 mg in 3.8 mL of water) and heated at 60° C. for 20 minutes.

The deposition of silver is initiated, by addition to the previous preparation, of a solution of silver nitrate $AgNO_3$, and a solution containing ascorbic acid AA and CTAC.

For example, the deposition of silver is initiated by addition of a solution of silver nitrate $AgNO_3$ (2 mM, 1.2 mL), and a solution containing ascorbic acid (AA, 45 mM, 1.2 mL) and CTAC (40 mM).

A complete preparation protocol $\underline{P}$ is as follows, in one embodiment.

In a tube containing 300 µl of gold nanorods (C=0.15 nM), 100 µL of DMSO is introduced, and the solution is left to rest for 5 minutes, then added to an aqueous solution of CTAC (26 mg of CTAC in 4.6 mL of Milli-Q water previously heated to 60° C. The resulting solution is agitated in a bain marie at 60° C. for 20 minutes. The deposition step is initiated by the addition of 1.2 mL of a solution of $AgNO_3$ at 2 mM and 1.2 mL of an AA solution (44 mM)/CTAC (40 mM) protected from light. The addition is done drop by drop under moderate agitation. The deposition of silver is stopped after 100 minutes, centrifuging at 6000 RPM for eight minutes.

Another preparation protocol makes it possible to work at a larger scale, as a first step towards the industrialization of the synthesis method. This method, in an implementation enabling up to 1000 times more gold-silver core-shell particles to be produced, is as follows:

In 16 tubes each containing 150 µL gold nanorods (C=17 nM), 1.15 mL of DMSO is introduced, and the solution is allowed to rest for 10 minutes. The contents of the 16 tubes is added to an aqueous solution of CATC (320 mg of CATC in 22 mL water) previously heated to 60° C. The resulting solution is held at 60° C. under agitation for 20 minutes. The deposition step is initiated by the addition of 10 mL of a solution of $AgNO_3$ at 4 mM and 10 mL of an AA solution (100 mM)/CTAC (80 mM) protected from light. The addition is done drop by drop under moderate agitation. The deposition of silver is stopped after a period of between 90 minutes and 20 hours (depending on the desired shape of particle), centrifuging at 6000 RPM for five minutes.

The shape of the final object and the thickness of deposited silver are modulated by the proportion of DMSO in the mixture, the quantity of silver precursor and the reaction time prior to centrifuging the mixture.

The shape of the gold/silver core-shell nanoparticles is that of an ogive, as shown in FIG. 2.

The deposition of silver is done essentially along the small axis and the points of the gold rods outcrop at the surface of the core-shells. These anisotropic depositions in both directions result in a lowering of the aspect ratio, which is 1.4 for the core-shell nanoparticles, compared to a ratio of 3.9 for the initial gold nanorods.

The deposition of silver onto the gold is followed by UV-vis light extinction spectroscopy with a progressive shift of the longitudinal plasmon resonance towards the blue.

The optical properties of the core-shell nanoparticles obtained, the position of the extinction band corresponding to the longitudinal plasmon resonance of the nanoparticles can be modulated between 510 and 800 nm, depending on the thickness of the deposition of silver and the aspect ratio of the initial gold seed.

Taking advantage of the localized surface plasmon resonance of the synthesized gold/silver nanoparticles and the better enhancement expected for the silver (compared to the gold alone), surface enhanced Raman scattering characterizations have been carried out in solution in presence of molecular probes.

The spectra show an enhancement of the Raman signal between 4 and 100 times, compared to what was recorded for gold/silver core-shell nanoparticles obtained in water with no co-solvent.

By this synthesis, the gold/silver core-shell nanoparticles obtained by the method according to the invention contain traces of DMSO that are visible by spectroscopy.

Once isolated and deposited on a solid support (silicon slide for example), the core-shells thus obtained self-organize spontaneously into 3D network, 2D structure or 1D chain, of lengths (or surface areas) greater than 1 micrometer, depending on the concentration of solution deposited and the shape of the core-shell nanoparticles. FIGS. 6 and 7 show some examples of arrangement obtained.

As illustrated in FIGS. 6 and 7, the networks of gold/silver core-shell nanoparticles (NP) organized in 1D, 2D or 3D have a long-range order going from a few microns to several tens of microns. For the 2D and 3D arrangements, they can have surface areas of at least 10 square micrometers, advantageously 40 square micrometers, and even greater, and which are repeated on the substrate. These large surface areas obtained can be explained in particular by the fact of the homogeneity of shape of the nanoparticles obtained by the method.

As illustrated on the 3D structure in FIG. 6, the NPs have colors that are white, somewhat grayed or more grayed depending on their distance to the microscope.

These networks are obtained in particular with gold/silver core-shell nanoparticles having a single seed of gold encased in a shell of silver.

Depending in particular on the concentrations used of surfactants, gold-silver core-shell nanoparticles, thickness of the silver layer, size of the gold seeds, certain arrangements are obtained. For example, gold seeds encased by a small deposition of silver (less than 5 nm) give 1D chains, while gold/silver core-shell particles with a thicker layer of silver (10 nm and more) are organized rather in 2D or 3D networks. Moreover, these ordered ranges will be remote on the silicon substrate if the deposition is done from diluted solutions of gold-silver core-shell nanoparticles in water.

Influence of the Quantity of Co-Solvent

Tests were conducted, by
    maintaining the type and quantity of initial gold seed, the quantity of the reducing agent and of the silver precursor, the reaction time prior to centrifuging;
    varying the DMSO/H$_2$O ratio Depending on the proportion of DMSO added to the medium, three limiting behaviors have been identified in solution, by absorption spectroscopy, as illustrated in FIG. 4.

For DMSO/H$_2$O ratios lower than 0.33 (here, ratio by volume=Volume DMSO/Total volume of water), the stability of the gold nanorods is maintained in solution and they remain at a distance from one another.

For a DMSO/H$_2$O ratio of 1 in the initial solution, a point-to-point assembly in solution of the gold nanorods is evidenced (FIG. 9).

This assembly is detected by the appearance in a short time of a band, shifted towards the red relative to the longitudinal Plasmon resonance band of the initial nanorods. Point-to-point assembly (or head-to-head HH), here denotes the observation of the convergence of the end parts of the nanorods, contiguous nanorods being aligned between them or forming an angle between them.

Finally, for a larger DMSO-H$_2$O ratio (1.5) in the starting solution, kinetic monitoring by absorption spectroscopy over time shows an increasing shift towards the blue of the longitudinal resonance and an increasing shift towards the red of the transverse resonance. These spectral changes are characteristics of a face-to-face (FF) assembly of the nanoparticles (FIG. 9). Face-to-face assembly here designates the observation of the convergence of the nanorods by their lateral faces, the thin directions of contiguous nanorods being substantially parallel.

FIG. 9 illustrates the different states of the gold nanorods, as a function of the percentage of DMSO (proportion of DMSO in the water+DMSO mixture).

At a value of 50% DMSO, the gold nanorods are assembled in solution point-to-point.

At a value of 60% DMSO, the gold nanorods appear assembled in solution paired face-to-face.

At a value of 25% (or less than 25%) of DMSO, the gold nanorods appear dispersed in solution. For proportions of DMSO between these characteristic values, the gold nanorods are in the form of two types of populations, for example assembled face-to-face and point-to-point, for proportions of DMSO between 50 and 60%.

For percentages of DMSO in the mixture between 80 and 95%, the gold nanorods again appear dispersed in solution and the nanoparticles produced subsequently have a single seed of gold per shell of silver.

Thus, using a water-DMSO mixture as described in the invention makes it possible:
    to selectively orient the growth of the silver on the gold surface, and/or
    to assemble the gold seeds in face-to-face (FF) or head to head (HH) solution, or leave them isolated from each other before making the layer of silver grow around them.

After incubation in the water-DMSO mixture, the particles preserve their layer of surfactants without which the particles would precipitate irreversibly, making the mixture unusable. The addition of DMSO plays two parts. On the one hand, the DMSO makes it possible to modify the organization of the surfactant (by playing on the zeta potential of the colloidal suspension) at the surface of the gold seeds, and on the other hand, it is adsorbed on some facets of the gold seeds as revealed by the SERS studies. The surfactants (CTAB, CTAC) are always present on the surface of the seeds, but adopt a different organization in the presence of the DMSO.

The origin of the observed phenomena is not completely clear, the following hypotheses being advanced.

The DMSO is a dipolar aprotic solvent of highly dissociative nature and capable of solubilizing polarizable, polar and ionic compounds.

This type of solvent has mesomeric effect charges and is coordinated on one particular face (111) of the gold mono crystal (CFC) of the gold, by ionic interaction between its negatively charged oxygen and one or two positively charged ad-atoms of gold. Consequently, said layer may contaminate the surface of the gold, thus inhibiting the growth of the silver. The points of the nanorods, essentially composed of facets (111), can be coordinated by the DMSO, thus significantly disturbing the diffusion towards the surface and the deposition of silver on said facets The coordination of the DMSO on the gold would occur via the two possible coordination modes for this ligand (S-donor or O-donor).

Comparison of the Effects of Different Co-Solvents

Tests have been carried out to compare the effects of the DMSO to that of other co-solvents:

acetonitrile (MeCN, CAS 75-05-8), aprotic polar solvent;
ethanol (EtOH, CAS 64-17-5), aprotic polar solvent;
tetrahydrofuran (THF, CAS 109-99-9), aprotic polar solvent.

The protocol P previously presented was applied by replacing the DMSO with ethanol, or by replacing the volume of DMSO with 75 µl of MeCN and 25 µl of Milli-Q water, or by replacing the volume of DMSO with the Milli-Q water.

Different depositions of silver were carried out on gold seeds preincubated in a water/co-solvent mixture (hereinafter identified as NRsEtOH, NRsMeCN and NRsDMSO respectively for a mixture with EtOH, MeCN and DMSO).

These depositions were compared to the same silver deposition on gold nanorods incubated in water only.

The kinetic monitoring of the reactional media was performed by UV-vis absorption spectroscopy, as shown in FIG. 5-A.

The variations of the wavelength of the maximum of the longitudinal resonance band ($\Delta$LLSP) as a function of time show a shift towards the blue of this band, correlated with a deposition of silver along the small axis of the rod.

After 45 min, the largest shift of the LLSP is recorded for gold nanorods incubated in the DMSO ($\Delta$LLSP) DMSO=227 nm, ($\Delta$LLSP) H2O, MeCN=197 nm, ($\Delta$LLSP) EtOH=183 nm); as represented in FIG. 5-B.

The speed of deposition of silver on these NRsDMSO is faster than that of deposition of silver on NRsMeCN, NRsEtOH and NRsH$_2$O (used as reference).

Disturbance of the surfactant layer by adding organic solvent such as ethanol or acetonitrile does not directly affect the shape of the final core-shells. The modifications are restricted to slight differences in the level of kinetics of silver deposition onto the gold and the wavelength of the longitudinal resonance of the objects, attributed to the difference in solubility of the surfactant present on the surface of the gold in the water, ethanol and acetonitrile.

In contrast, for the DMSO, kinetic monitoring shows a displacement towards the blue of the longitudinal and transverse resonances, and resonances that are narrower and more intense. These spectral modifications may be due to a deposition of silver that is greater, or to morphological differences of the objects obtained.

Tests of Silver Overgrowth on Gold/Silver Core-Shells to Give Particular Shapes to the Nanoparticles Tests of silver overgrowth on core-shells incubated in DMSO were performed. A shift towards the blue of the wavelength of the longitudinal resonance of initial objects is noted. The MEB images show that the deposition is done essentially along the small axis and in a single direction, and the final objects resemble pyramids the base of which is a gold nanorod, as illustrated in FIG. 3.

Deposition of Silver on Dimers

We have shown the role of DMSO in assembling gold nanorods in face-to-face FF dimers for a quite specific water/DMSO ratio, as well as its effect on the final shape of the core-shell particles. Thus, the addition of DMSO in the colloidal solution such that the DMSO/H$_2$O ratio is equal to 1.5, results in this FF assembly of initial gold nanorods.

It should be noted that the addition of surfactant during the incubation step makes it possible to stop the assembly of gold seeds either head-to-head (HH) or face-to-face (FF) (depending on the ratio of DMSO volume to water volume). Thus, depending on the moment selected for this addition, assemblies of two, three, four, etc. gold seeds can be produced for the core, then encased by the silver shell.

This assembly is evidenced by increasing shift towards the blue of the longitudinal resonance and an increasing shift towards the red of the transverse resonance.

The assembly of the Au NRs in FF configuration is probably due to the depletion (attractive) forces, which destabilize the colloidal solution. It is the solubilizing power of the DMSO that is involved in this phenomenon of partial desorption of the surfactant of the bilayer of surfactant around particles.

The decrease in electrostatic repulsion between the rods, in addition to the Van der Waals attractive interactions between the hydrophobic chains thus exposed will be the driving force of the assembly first as dimer, then as oligomers over long periods of time.

To freeze the system in the dimers state and avoid the formation of oligomers, the concentration of CTAC surfactant in the medium is sharply increased beyond the CMC-$_{CTAC}$.

Indeed, the addition of CTAC in excess reforms the bilayer of CTAC with the hydrophobic chains exposed around dimers and avoids any aggregation by electrostatic repulsion.

The encapsulation of FF dimers in a layer of silver was done by reduction of the AgNO$_3$ precursor with ascorbic acid AA in the solution of dimers at 60° C.

A protocol for the production of core-shell dimer nanoparticles is as follows, in one implementation: to 100 µL of a solution of gold nanorods NRsAu (4 nM), a volume of 150 µL of DMSO is added and the face-to-face assembly of the gold nanorods is stopped by adding 800 µL of CTAC 8 mM. The solution is centrifuged and re-dispersed in 5 mL of CTAC 16 mM. To initiate the deposition, 1.2 mL of the aqueous solution of AgNO$_3$ at 2 mM and 1.2 mL of the aqueous solution AA (44 mM)/CTAC (40 mM) is added, protected from light. The addition is done drop by drop under moderate agitation. The deposition is stopped after 60 minutes, centrifuging at 6000 RPM for 8 minutes.

The deposition of silver is revealed during monitoring by absorption spectroscopy, by a shift of at least 100 nm towards the blue of the LLSP resonance after only three minutes of reaction.

The core-shell particles obtained are in the form of octahedrons, with more pronounced points, which gives them more advantageous enhancement properties, as shown in FIG. 3.

Applications

Comparative studies by SERS of particles obtained by this new synthesis method show an increase in SERS gain, relative to cuboid particles obtained conventionally in water. The SERS substrates of the invention have greater homogeneity in terms of response relative to those of the state of the art, due to the greater homogeneity of arrangement of the gold-silver core-shell nanoparticles deposited.

The gold-silver core-shell nanoparticles obtained (NRsAu@Ag) having more pointed ends will induce a stronger confinement of the field to the points.

Application to Detection of Atrazine (ATR)

To 183 µl of basic Milli-Q (pH equal to 6 adjusted by addition of NaOH 0.1 M), a volume X of ATR (1, 0.1, 0.01, 0.001 mM in the acetonitrile) and Y of β-CD or β-cyclodextrine (6, 0.66, 0.066, 0.0066 mM in water) are added. The solutions prepared in advance are added to 100 µl of NRsAu@Ag. The values of X and Y (between 4 and 16 µl) as well as the concentrations of the β-CD and ATR are chosen in such a way that the final concentrations of ATR and β-CD are equal to 0.05, 1, 3, 6, 12.5, 25, 100, 200 µM. The solutions are incubated for 1 hour prior to characterizing them by SERS.

Alpha-cyclodextrin can also be used to detect atrazine.

Advantages of the Invention

The invention has numerous advantages.

The invention allows the modulation of the shapes and self-assembly of gold-silver core-shell nanoparticles, by an original synthesis method in a water/organic co-solvent medium.

This synthesis method makes it possible to include one or more gold seeds of elongated shape (nanorod of dimension ranging from 15 to 150 nm), in a monocrystalline silver matrix.

It is possible to incorporate more than one nanorod gold seed. Indeed, the relative proportions of water/DMSO induce, for some compositions, a face-to-face assembly of the gold nanorods during the incubation step.

This process is remarkably simpler than those commonly used in the literature, to obtain more exotic shapes than the conventional cuboids.

During the overgrowth of the silver onto the gold, the shape of the core-shell particles is controlled by the deposition kinetics of the silver atoms onto the surface of gold.

The invention has numerous advantages for producing SERS substrates.

The bottom-up approach of preparation allows the modulation of the size, shape and therefore the position of the plasmon resonance of the substrate, making it possible to consider a plurality of laser excitation wavelengths (532, 632.8 and 785 nm).

Furthermore, the silver shell of the nanoparticles is an advantage in terms of enhancement factor, since the silver is known to be more effective than gold (interband responsible for losses by attenuation of the plasmon situated in the visible spectrum for gold and in the UV for the silver).

Moreover, the self-assembly on solid substrate of the nanoparticles obtained by the synthesis method opens it to SERS sensors applications.

A bottom-up production approach of these SERS substrates from colloids constitutes an alternative to the top-down approaches by physical lithography, which although expensive currently remain favored for commercial substrates (better reproducibility). One of the disadvantages of colloids, relative to lithographic substrates, is the more random and non-reproducible nature of the placement of the hot points. The self-assembly mechanisms of the nanoparticles allow a greater constancy of the properties of the substrates.

The spontaneous surface arrangements of the core-shell nanoparticles allow new SERS substrates to be prepared, for sensor applications, for example for the following applications:
  agri-food: for example to detect melamine in milk;
  scientific police/security: drugs, poison, explosives;
  environmental analysis of contaminants in water: PCB, atrazine, pesticide, hormones;
  biosensors (early detection of markers).

The intended applications fall within the field of chemical sensors using surface enhanced Raman scattering as a tool to quantify and identify the analyte of interest.

The invention claimed is:

1. A method of synthesizing gold-silver core-shell nanoparticles from a colloidal aqueous solution of gold seeds with surfactant, the gold-silver core-shell nanoparticles being produced from anisotropic gold seeds, characterized in that the method comprises successively:
   an incubation step of the colloidal aqueous solution containing the gold seeds with an initial surfactant, in a mixture of water solvents and DMSO, for a first given period of time, in order to modify the organization of the initial surfactant and the assembly of the gold seeds;
   a step adding an additional surfactant to the previous resultant mixture;
   a heating step for the resultant mixture, for a second given period of time;
   a step adding to the resultant mixture a precursor of silver and a reducing agent, to produce the deposition of silver onto the gold seeds in a step called principal during a third period of time;
   an extraction step of the nanoparticles.

2. The method as claimed in claim 1, characterized in that the ratio between the volume of DMSO and the total volume of water is less than 2 and greater than 0.1, the total volume of water being the volume contributed by the colloidal aqueous solution of gold seeds with the initial surfactant and by the water present in the mixture of solvents water+DMSO for incubation.

3. The method as claimed in claim 1, characterized in that the ratio between the volume of DMSO and the total volume of water is less than or equal to 0.33, the total volume of water being the volume contributed by the colloidal aqueous solution of gold seeds with the initial surfactant and by the water present in the mixture of solvents water+DMSO for incubation.

4. The method as claimed in either claim 1, characterized in that the ratio between the volume of DMSO and the total volume of water is 1, the total volume of water being the volume contributed by the colloidal aqueous solution of gold seeds with the initial surfactant and by the water present in the mixture of solvents water+DMSO for incubation.

5. The method as claimed in claim 1, characterized in that the ratio between the volume of DMSO and the total volume of water is 1.5, the total volume of water being the volume contributed by the colloidal aqueous solution of gold seeds with the initial surfactant and by the water present in the mixture of solvents water+DMSO for incubation.

6. The method as claimed in claim 1, characterized in that the ratio between the volume of DMSO and the total volume of water is less than 10 and greater than 2, the total volume of water being the volume contributed by the colloidal aqueous solution of gold seeds with the initial surfactant and by the water present in the mixture of solvents water+DMSO for incubation.

7. The method as claimed in claim 6, characterized in that the ratio between the volume of DMSO and the total volume of water is Greater than or equal to 4, the total volume of water being the volume contributed by the colloidal aqueous solution of gold seeds with the initial surfactant and by the water present in the mixture of solvents water+DMSO for incubation.

8. The method of synthesizing core-shell nanoparticles according to claim 1, characterized in that the step adding the additional surfactant takes place after a first optimal incubation time ranging from a few minutes to one hour and determined by spectroscopy, making it possible to control the assembly of the gold seeds and to obtain either one gold seed per silver shell, or two gold seeds per silver shell.

9. The method as claimed in claim 1, characterized in that the extraction step is achieved by centrifuging.

10. The method as claimed in claim 1, characterized in that the additional surfactant is chosen from the following list: cetyltrimethylammonium chloride (CTAC), cetyltrimethylammonium bromide (CTAB) or benzyldimethylhexadecylammonium chloride (BDAC).

11. The method as claimed in claim 1, characterized in that, after the extraction step, the method has a new step adding a precursor of silver and a reducing agent to the nanoparticles, in order to produce an overgrowth of silver.

12. The method as claimed in claim 1, characterized in that the reducing agent is a solution of ascorbic acid (AA) and surfactant, and in that the precursor of silver is silver nitrate.

13. Gold-silver core-shell nanoparticles produced from gold seeds of elongated shape, obtained by the method defined according to claim 1, and having traces of DMSO visible by spectroscopy.

14. The gold-silver core-shell nanoparticles as claimed in claim 13, characterized in that each gold-silver core-shell nanoparticle has at least two gold seeds encapsuled in the same silver shell enclosing the core.

15. The gold-silver core-shell nanoparticles as claimed in claim 14, characterized in that for each nanoparticle, the gold seeds are disposed head-to-head in the same silver shell.

16. The gold-silver core-shell nanoparticles as claimed in claim 14, characterized in that for each nanoparticle, the gold seeds are disposed face-to-face in the same silver shell.

17. The gold-silver core-shell nanoparticles as claimed in claim 14, characterized in that the gold seeds are nanorods.

18. The gold-silver core-shell nanoparticles as claimed in claim 17, characterized in that the nanorods have an average aspect ratio between 2 and 5.

19. A solid substrate for Surface Enhanced Raman Scattering (SERS) comprising gold-silver core-shell nanoparticles resulting from claim 13, the nanoparticles being organized in one or more 2D or 3D networks on surface areas of more than 10 $\mu m^2$, advantageously more than 40 $\mu m^2$, for each 2D or 3D network.

20. A solid substrate for Surface Enhanced Raman Scattering (SERS) comprising gold-silver core-shell nanoparticles resulting from claim 13, the nanoparticles being organized in one or more 1D chains, the 1D change having characteristic dimensions ranging from 2 to 3 $\mu m$.

21. The application of the substrate as claimed in claim 19 to the detection by SERS of analytes such as organic pollutants.

22. The application as claimed in claim 21, the analyte being atrazine, the cold-silver core-shell nanoparticles being used with beta-cyclodextrin (CAS 7585-39-9) or alpha-cyclodextrin (CAS 10016-20-3).

23. The application as claimed in claim 21, the analyte being chosen from the following list: thiram (CAS 137-26-8), phosmet (CAS 732-11-6), malathion (CAS 121-75-5), (4,4')-BPE (CAS 13362-78-2), 4-mercaptobenzoïque acid (CAS 1074-36-8).

24. The method as claimed in claim 1, where the initial surfactant is the same as the additional surfactant.

25. The method as claimed in claim 1, where the initial surfactant is different from the additional surfactant.

* * * * *